United States Patent
Wenxu et al.

(10) Patent No.: US 8,748,969 B2
(45) Date of Patent: Jun. 10, 2014

(54) NON-VOLATILE MEMORY DEVICE INCLUDING DUMMY ELECTRODES AND METHOD OF FABRICATING THE SAME

(75) Inventors: Xianyu Wenxu, Yongin-si (KR);
Jung-hyun Lee, Suwon-si (KR);
Dong-joon Ma, Anyang-si (KR);
Yeon-hee Kim, Seoul (KR);
Yong-young Park, Daejeon (KR);
Chang-soo Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 486 days.

(21) Appl. No.: 12/654,470

(22) Filed: Dec. 22, 2009

(65) Prior Publication Data

US 2010/0155826 A1 Jun. 24, 2010

(30) Foreign Application Priority Data

Dec. 19, 2008 (KR) ........................ 10-2008-0130383

(51) Int. Cl.
*H01L 29/792* (2006.01)

(52) U.S. Cl.
USPC .... 257/324; 257/316; 257/211; 257/E27.103; 365/185.17

(58) Field of Classification Search
USPC .......... 257/211, 316, 324, E27.103; 365/182, 365/184, 185.17
See application file for complete search history.

(56) References Cited

U.S. PATENT DOCUMENTS

| | | |
|---|---|---|
| 6,737,675 B2 | 5/2004 | Patel et al. |
| 7,291,878 B2 | 11/2007 | Stipe et al. |
| 7,315,059 B2 | 1/2008 | Endoh et al. |
| 2008/0128780 A1 | 6/2008 | Nishihara et al. |
| 2009/0097309 A1* | 4/2009 | Mizukami et al. ............ 365/184 |

FOREIGN PATENT DOCUMENTS

| | | |
|---|---|---|
| JP | 06-338602 | 12/1994 |
| JP | 2004-362753 | 12/2004 |
| JP | 2007-266143 | 10/2007 |

(Continued)

OTHER PUBLICATIONS

H. Sakuraba, et al., "New Three-Dimensional High-Density Stached-Surrounding Gate Transistor (S-SGT) Flash Memory Architecture Using Self-Aligned Interconnection Fabrication Technology without Photolithography Process for Tera-Bits and Beyond," *Japanese Journal of Applied Physics*, vol. 43, No. 4B, pp. 2217-2219 (2004).

(Continued)

*Primary Examiner* — Robert Huber
(74) *Attorney, Agent, or Firm* — Harness, Dickey & Pierce, P.L.C.

(57) ABSTRACT

Provided are a non-volatile memory device and a method of fabricating the same. The non-volatile memory device may include a substrate and a plurality of semiconductor pillars on the substrate. A plurality of control gate electrodes may be stacked on the substrate and intersecting the plurality of semiconductor pillars. A plurality of dummy electrodes may be stacked adjacent to the plurality of control gate electrodes on the substrate, the plurality of dummy electrodes being spaced apart from the plurality of control gate electrodes. A plurality of via plugs may be connected to the plurality of control gate electrodes. A plurality of wordlines may be on the plurality of via plugs. Each of the plurality of via plugs may penetrate a corresponding one of the plurality of control gate electrodes and at least one of the plurality of dummy electrodes.

13 Claims, 16 Drawing Sheets

(56) References Cited

FOREIGN PATENT DOCUMENTS

| | | |
|---|---|---|
| JP | 2008-072051 | 3/2008 |
| KR | 10-0796642 | 1/2008 |
| KR | 10-0798816 | 1/2008 |
| KR | 10-2008-0024971 | 3/2008 |

OTHER PUBLICATIONS

Tanaka, et al., "Bit Cost Scalable Technology with Punch and Plug Process for Ultra High Density Flash Memory", 2007 Symposium on VLSI Technology Digest of Technical Papers, pp. 14-15 (2007).

Y. Helen, et al., "High mobility thin film transistors by Nd:YVO4-laser crystallization," *Thin Solid Films*, vol. 383, pp. 143-146 (2001).

* cited by examiner

NON-VOLATILE MEMORY DEVICE INCLUDING DUMMY ELECTRODES AND METHOD OF FABRICATING THE SAME

CROSS-REFERENCE TO RELATED APPLICATIONS

This application claims priority under 35 USC §119 to Korean Patent Application No. 10-2008-0130383, filed on Dec. 19, 2008, in the Korean Intellectual Property Office (KIPO), the entire contents of which are incorporated herein by reference.

BACKGROUND

1. Field

Example embodiments relate to a semiconductor device, and more particularly, to a non-volatile memory device and a method of fabricating the same.

2. Description of the Related Art

The sizes of semiconductor devices are continuously being reduced, while at the same time the semiconductor devices have to process larger amounts of data. Therefore, improving the integration of non-volatile memory devices used in such semiconductor devices may be necessary. In this regard, memory cells may be vertically stacked in a non-volatile memory device having a multi-layer structure, and thus, the non-volatile memory device having a multi-layer structure may be further integrated as compared to a non-volatile memory device having a single layer structure.

Developing a contact structure within a non-volatile memory device having a multi-layer structure is not easy, and, due to the complexity of the contact structure, integration of the non-volatile memory device is limited and a method of fabricating the same becomes more complicated.

SUMMARY

Example embodiments include a non-volatile memory device, of which integration and quality of a channel layer is improved by simplifying a contact structure, and a method of fabricating the same. Additional aspects will be set forth in part in the description which follows and, in part, will be apparent from the description, or may be learned by practice of example embodiments.

According to example embodiments, a non-volatile memory device may include a substrate; a plurality of semiconductor pillars on the substrate; a plurality of control gate electrodes stacked on the substrate and intersecting the plurality of semiconductor pillars; a plurality of dummy electrodes stacked adjacent to the plurality of control gate electrodes on the substrate, the plurality of dummy electrodes being spaced apart from the plurality of control gate electrodes; a plurality of via plugs connected to the plurality of control gate electrodes; and a plurality of wordlines on the plurality of via plugs, wherein each of the plurality of via plugs penetrates a corresponding one of the plurality of control gate electrodes and at least one of the plurality of dummy electrodes.

The plurality of control gate electrodes may include protrusions connected to the plurality of via plugs, and each of the plurality of dummy electrodes may be adjacent to and spaced apart from the protrusions.

The protrusions of the plurality of control gate electrodes may be stacked such that the protrusions do not overlap each other. The protrusions of the plurality of control gate electrodes may be alternately stacked at two opposite sides of the plurality of control gate electrodes. Alternatively, the protrusions of the plurality of control gate electrodes may be stacked in a cascade shape at one side of the plurality of control gate electrodes such that the protrusions do not overlap each other.

The non-volatile memory device may further include a plurality of charge storage layers between the sidewalls of the plurality of semiconductor pillars and the plurality of control gate electrodes. The non-volatile memory device may further include a plurality of tunneling insulation layers between the sidewalls of the plurality of semiconductor pillars and the plurality of charge storage layers; and a plurality of blocking insulation layers between the plurality of charge storage layers and the plurality of control gate electrodes.

According to example embodiments, a non-volatile memory device may include a substrate; a plurality of semiconductor pillars arranged in columns and rows on the substrate; a plurality of control gate electrodes stacked on the substrate and intersecting the plurality of semiconductor pillars; a plurality of via plugs connected to the plurality of control gate electrodes; a plurality of wordlines on the plurality of via plugs; a plurality of bitlines on the plurality of control gate electrodes to connect the plurality of semiconductor pillars in a horizontal direction; a plurality of upper select gate electrodes on the plurality of control gate electrodes and intersecting the plurality of semiconductor pillars in a horizontal direction; and a plurality of lower select gate electrodes on portions of the substrate adjacent to the plurality of semiconductor pillars in a vertical direction and below the plurality of control gate electrodes, the plurality of lower select gate electrodes extending in a same direction as the plurality of bitlines.

According to example embodiments, a method of fabricating a non-volatile memory device may include stacking a plurality of control gate electrodes and a plurality of dummy electrodes on a substrate, wherein the plurality of dummy electrodes are spaced apart from the plurality of control gate electrodes; forming a plurality of semiconductor pillars penetrating the plurality of control gate electrodes; forming a plurality of via plugs that are connected to the plurality of control gate electrodes, wherein each of the plurality of via plugs penetrates a corresponding one of the plurality of control gate electrodes and at least one of the plurality of dummy electrodes; and forming a plurality of wordlines on the plurality of via plugs.

Forming the plurality of semiconductor pillars may include forming a plurality of amorphous semiconductor layers penetrating the plurality of control gate electrodes; and re-crystallizing the plurality of amorphous semiconductor layers by performing ELA (excimer laser annealing). After the re-crystallization of the plurality of amorphous semiconductor layers, the plurality of semiconductor pillars may have columnar crystal structure extending in an upward direction from the substrate.

The method may further include forming a plurality of interlayer insulation layers between the plurality of control gate electrodes and between the plurality of dummy electrodes; and planarizing the plurality of interlayer insulation layers.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
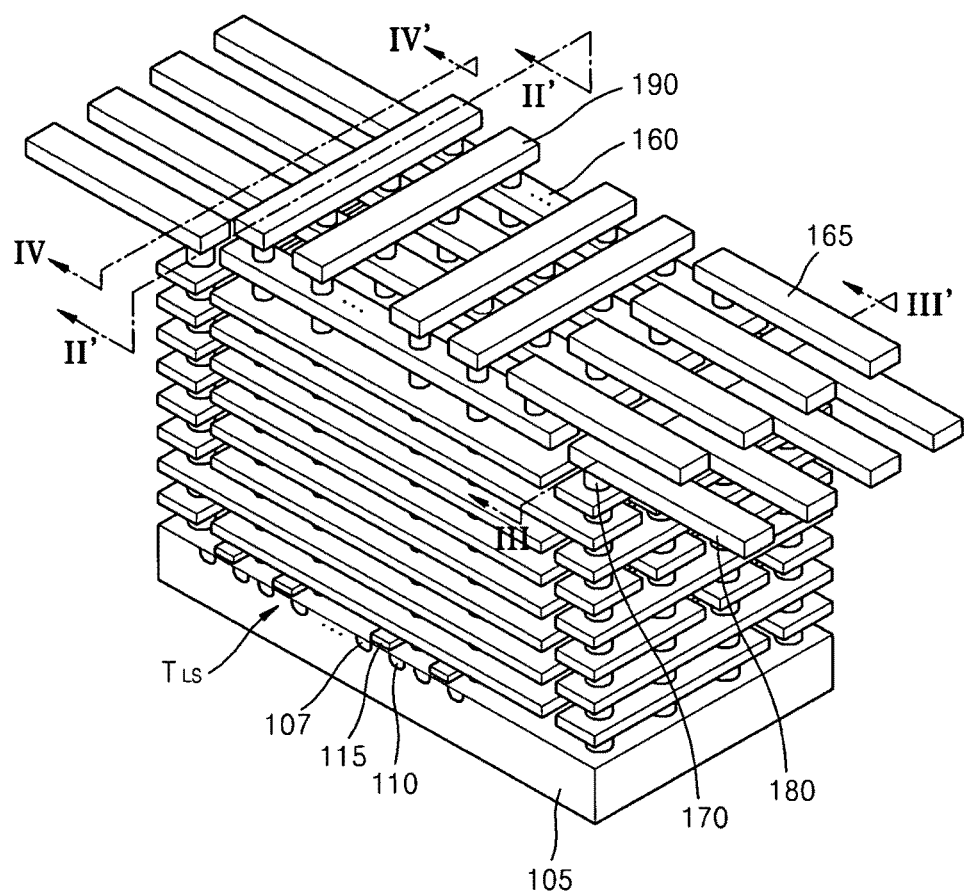
FIG. 1 is an oblique view of a non-volatile memory device according to example embodiments.

Example embodiments will now be described more fully hereinafter with reference to the accompanying drawings, in which example embodiments are shown. Example embodiments may, however, be embodied in different forms and should not be construed as limited to example embodiments set forth herein. Rather, example embodiments are provided so that this disclosure is thorough and complete and fully conveys the scope of example embodiments to one skilled in the art. In the drawings, the thicknesses of layers and regions are exaggerated for clarity.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
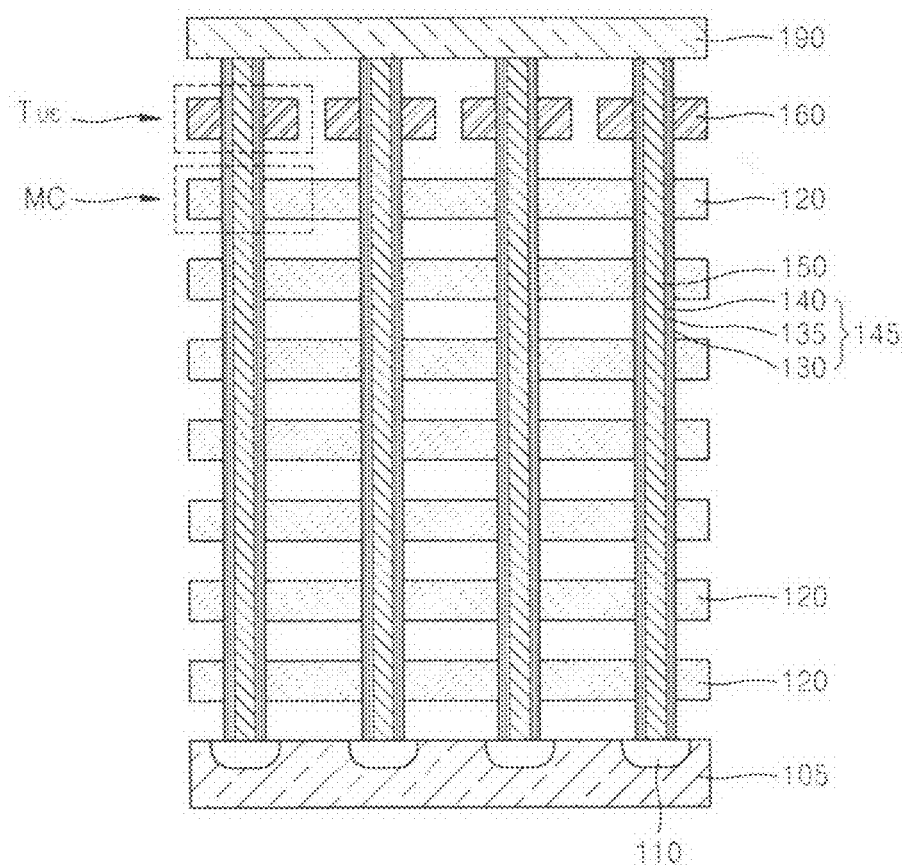
FIG. 2 is a cross-sectional view of the non-volatile memory device of FIG. 1, taken along a line II-III' of FIG. 1.
Figure 3:
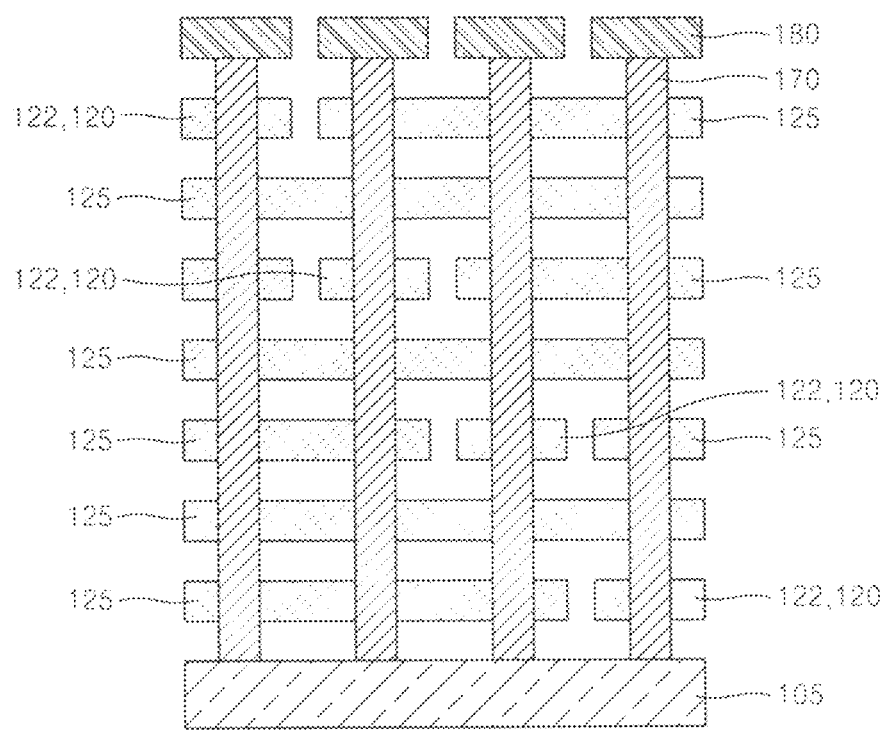
FIG. 3 is a cross-sectional view of the non-volatile memory device of FIG. 1, taken along a line III-III' of FIG. 1.
Figure 4:
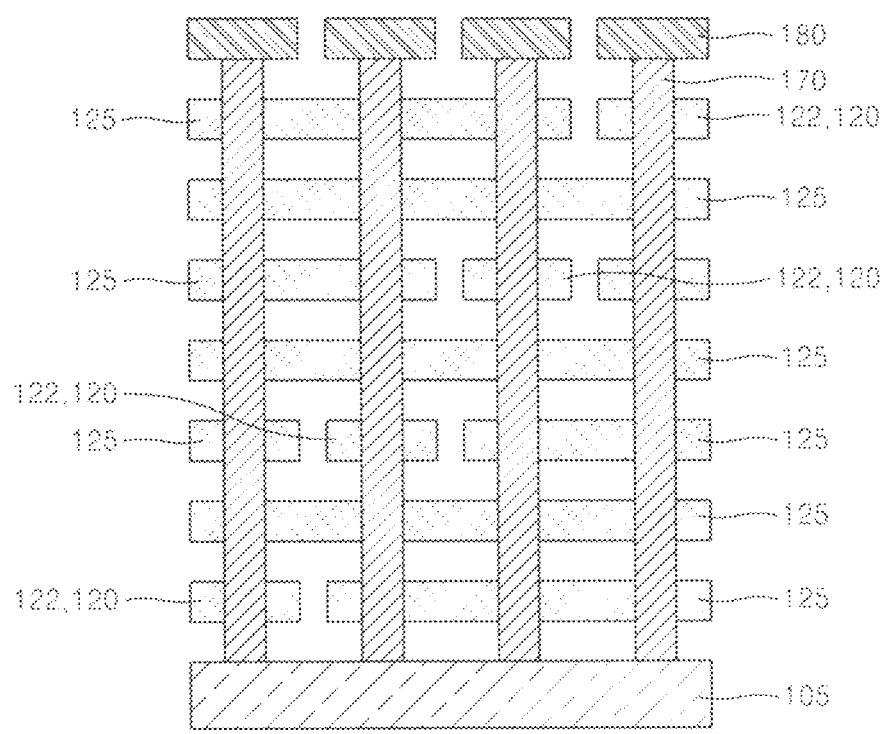
FIG. 4 is a cross-sectional view of the non-volatile memory device of FIG. 1, taken along a line IV-IV' of FIG. 1.

FIG. 1 is an oblique view of a non-volatile memory device according to example embodiments. FIG. 2 is a cross-sectional view of the non-volatile memory device, taken along a line II-II' of FIG. 1. FIG. 3 is a cross-sectional view of the non-volatile memory device, taken along a line III-III' of FIG. 1. FIG. 4 is a cross-sectional view of the non-volatile memory device, taken along a line IV-IV' of FIG. 1.

Referring to FIGS. 1 through 4, a non-volatile memory device according to example embodiments may include a substrate 105. For example, the substrate 105 may contain a semiconductor material; e.g. silicon, germanium, or silicon-germanium. The substrate 105 may include drain regions 110. Each of the drain regions 110 may form a diode junction with the substrate 105. For example, where the substrate 105 is doped with first conductive impurities, the drain regions 110 may be doped with second conductive impurities, wherein the second conductive impurities are a type of impurities opposite to the first conductive impurities.

A plurality of semiconductor pillars 150 may be disposed on the substrate 105. The plurality of semiconductor pillars 150 may extend upward from the substrate 105. For example, the plurality of semiconductor pillars 150 may extend upward vertically from the substrate 105. Lower portions of the plurality of semiconductor pillars 150 may be connected to the drain regions 110. Arrangements of the plurality of semiconductor pillars 150 may vary. For example, the plurality of semiconductor pillars 150 may be arranged in a plurality of columns and a plurality of rows, that is, in a matrix shape. The number of plurality of semiconductor pillars 150 may be selected according to the capacity of a non-volatile memory device, and does not limit the scope of example embodiments.

The plurality of semiconductor pillars 150 may have various crystal structures. For example, the plurality of semiconductor pillars 150 may have a columnar structure extending upward from the substrate 105 as described below. Alternatively, the plurality of semiconductor pillars 150 may have either a single-crystal structure or a multi-crystal structure arranged in a random direction. The plurality of semiconductor pillars 150 may have various shapes. For example, the plurality of semiconductor pillars 150 may be either cylindrical or polygonal pillars.

A plurality of control gate electrodes 120 may be stacked apart from each other on the substrate 105. The control gate electrodes 120 may intersect the plurality of semiconductor pillars 150. For example, each of the control gate electrodes 120 may have a plate shape and may surround sidewalls of the plurality of semiconductor pillars 150. Although the number of illustrated control gate electrodes 120 is 8, example embodiments may not be limited thereto.

As illustrated in FIGS. 3 and 4, the control gate electrodes 120 may include protrusions 122. For example, the protrusions 122 may refer to portions of the control gate electrodes 120 protruding parallel to the substrate 105.

The protrusions 122 may be stacked such that at least some portions of the protrusions 122 do not overlap each other. For example, the protrusions 122 may be stacked such that all portions of the protrusions 122 do not substantially overlap each other in example embodiments. For example, the protrusions 122 may be arranged to be offset in an upward direction, that is, may be arranged in a cascade formation. The protrusions 122 may be alternately disposed on two opposite surfaces of the control gate electrodes 120 facing each other.

A plurality of dummy electrodes 125 may be stacked adjacent to but spaced apart from the control gate electrodes 120 on the substrate 105. Because the dummy electrodes 125 are spaced apart from the control gate electrodes 120, the dummy electrodes 125 are not used for transmitting signals of the control gate electrodes 120. For example, the dummy electrodes 125 may be disposed on a same plane as the control gate electrodes 120, and may be disposed adjacent to the protrusions 122. The dummy electrodes 125 may be stacked vertically on each of the protrusions 122. The protrusions 122 and the dummy electrodes 125 may be disposed at outermost sides of the plurality of semiconductor pillars 150.

A plurality of via plugs 170 may be electrically connected to the control gate electrodes 120 via the protrusions 122. For example, the via plugs 170 may be disposed to penetrate a stacked structure of the protrusions 122 and the dummy electrodes 125. Each of the via plugs 170 may contact corresponding protrusions 122. Because the dummy electrodes 170 are isolated from the control gate electrodes 120 and the plurality of semiconductor pillars 150, contact between the via plugs 170 and the dummy electrodes 125 does not affect signal transmission.

A plurality of wordlines 180 may be disposed on and connected to the via plugs 170. Therefore, the wordlines 180 may be disposed at two opposite sides of the uppermost control gate electrode 120. The wordlines 180 may be connected to the protrusions 122 via the via plugs 170, and thus, the wordlines 180 may be connected to the control gate electrodes 120. The number of via plugs 170 and the number of wordlines 180 may be the same as the number of control gate electrodes 120.

In example embodiments, the via plugs 170 may have identical shapes and heights. The via plugs 170 may be arranged in a line, and may occupy a relatively small area. Therefore, in example embodiments, arrangements of the via plugs 170 and the wordlines 180 may be simplified.

As illustrated in FIG. 2, a plurality of storage media 145 may be disposed between the control gate electrodes 120 and the plurality of semiconductor pillars 150. For example, the storage media 145 may be disposed to surround the sidewalls of the plurality of semiconductor pillars 150. The storage media 145 may include tunnelling insulation layers 140, charge storage layers 135, and blocking insulation layers 130. For example, the charge storage layers 135 may be disposed between the plurality of semiconductor pillars 150 and the control gate electrodes 120, the tunnelling insulation layers 140 may be disposed between the plurality of semiconductor pillars 150 and the charge storage layers 135, and the blocking insulation layers 130 may be disposed between the charge storage layers 135 and the control gate electrodes 120.

The charge storage layers 135 may be formed of materials capable of storing charges. For example, the charge storage layers 135 may contain charge trapping materials, e.g., silicon nitride layers, quantum dots, or nanocrystals. The quantum dots or the nanocrystals may be formed of fine particles of metals or semiconductors. Such charge storage layers 135 may store charges in a local region, and thus, the charge storage layers 135 may be used for multi-bit operations.

The tunnelling insulation layers 140 and the blocking insulation layers 130 may be formed of suitable insulation materials, e.g., oxides, nitrides, and high-k dielectric materials, or may have a stacked structure of two or more of the above described materials. In example embodiments, high-k dielectric materials may refer to dielectric materials of which dielectric constants are higher than those of oxides and nitrides.

A plurality of bitlines 190 may be connected to the plurality of semiconductor pillars 150 at the side opposite to the substrate 105. For example, the bitlines 90 may extend in the column direction to connect the plurality of semiconductor pillars 150 that are arranged in a vertical direction. Therefore, a number of the bitlines 190 may be the same as a number of rows of the plurality of semiconductor pillars 150.

A plurality of upper select gate electrodes 160 may be disposed between the bitlines 190 and the control gate electrodes 120. For example, the upper select gate electrodes 160 may extend in the row direction to intersect the plurality of semiconductor pillars 150 in a horizontal direction. Therefore, a number of the upper select gate electrodes 160 may be the same as the number of rows of the semiconductor pillars 150. The storage media 145 between the upper select gate electrodes 160 and the plurality of semiconductor pillars 150 may either function as gate insulating layers or, unlike as illustrated in FIG. 2, may be replaced with a single insulation layer.

Upper select lines 165 may be connected to the upper select gate electrodes 160. The upper select lines 165 and the bitlines 190 may be disposed to cross each other. For example, the upper select lines 165 and the bitlines 190 may be disposed to perpendicularly cross each other.

A plurality of lower select gate electrodes 115 may be disposed between the substrate 105 and the control gate electrodes 120. For example, the lower select gate electrodes 115 may be disposed adjacent to the plurality of semiconductor pillars 150 to extend toward the bitlines 190. The drain regions 110 may be disposed in the substrate 105 at sidewalls of the lower select gate electrodes 115. A plurality of source regions 107 may be disposed at the side opposite to the drain regions 110 across the lower select gate electrodes 115.

In example embodiments, the combined structures of the control gate electrodes 120 and the plurality of semiconductor pillars 150 may constitute memory cells MC. The combined structure of the upper select gate electrodes 160 and the plurality of semiconductor pillars 150 may constitute upper select transistors $T_{US}$. The combined structure of the lower select gate electrodes 115 and the substrate 105 may constitute lower select transistors $T_{LS}$. The line structure from the bitlines 190 via the upper select transistors $T_{US}$, the memory cells MC and the lower select transistors $T_{LS}$, to the source regions 107 may constitute a plurality of NAND strings.

In example embodiments, the lower select transistors $T_{LS}$ may have a planar channel structure, whereas the memory cells MC and the upper select transistors T $T_{US}$ may have a vertical channel structure. Therefore, the NAND strings may be vertically arranged on the substrate 105, and thus, integration density of a non-volatile memory device may be increased. Furthermore, simplification of arrangements of the via plugs 170 and the wordlines 180 may further increase integration density of the non-volatile memory device and may improve reliability of the non-volatile memory device.

Figure 5:
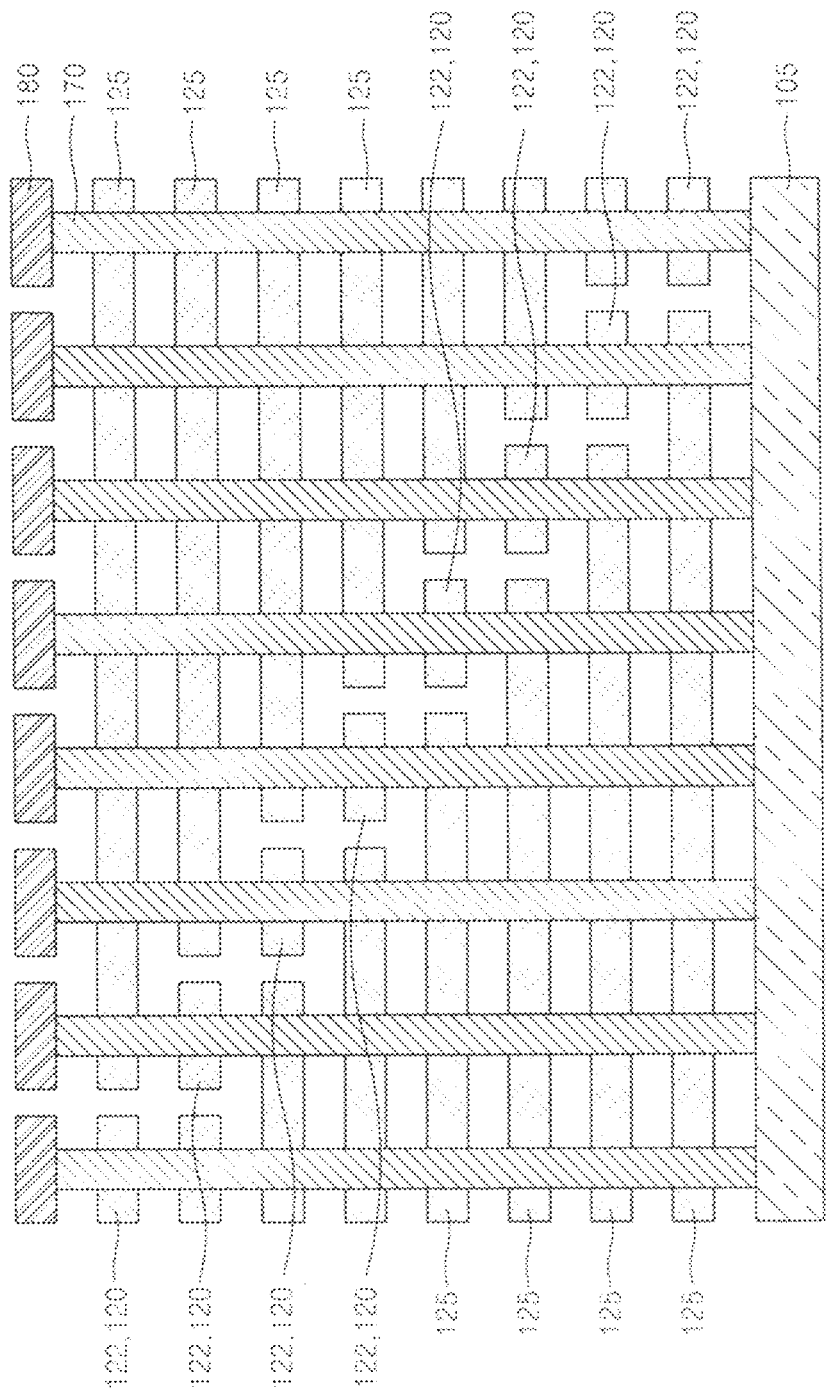
FIG. 5 is a cross-sectional view of a non-volatile memory device according to example embodiments.

FIG. 5 is a cross-sectional view of a non-volatile memory device according to example embodiments. A non-volatile memory device as illustrated in FIG. 5 may be a modified form of the non-volatile memory device illustrated in FIGS. 1 through 4. More particularly, the non-volatile memory device illustrated in FIG. 5 may be a modified form of the non-volatile memory device shown in FIG. 3 or 4. Descriptions of elements identical in example embodiments will be omitted.

Referring to FIG. 5, the protrusions 122 may only be disposed at one side of the control gate electrodes 120. The protrusions 122 may be disposed to be sequentially offset in an upward direction from the substrate 105, and thus, the protrusions 122 may have a cascade structure. The dummy electrodes 125 may be disposed adjacent to the protrusions 122.

The via plugs 170 may penetrate the protrusions 122 and the dummy electrodes 125. The wordlines 180 may be disposed on the via plugs 170. The wordlines 180 may be connected to the protrusions 122 via the via plugs 170, and thus, the wordlines 180 may be connected to the control gate electrodes 120.

Figure 6:
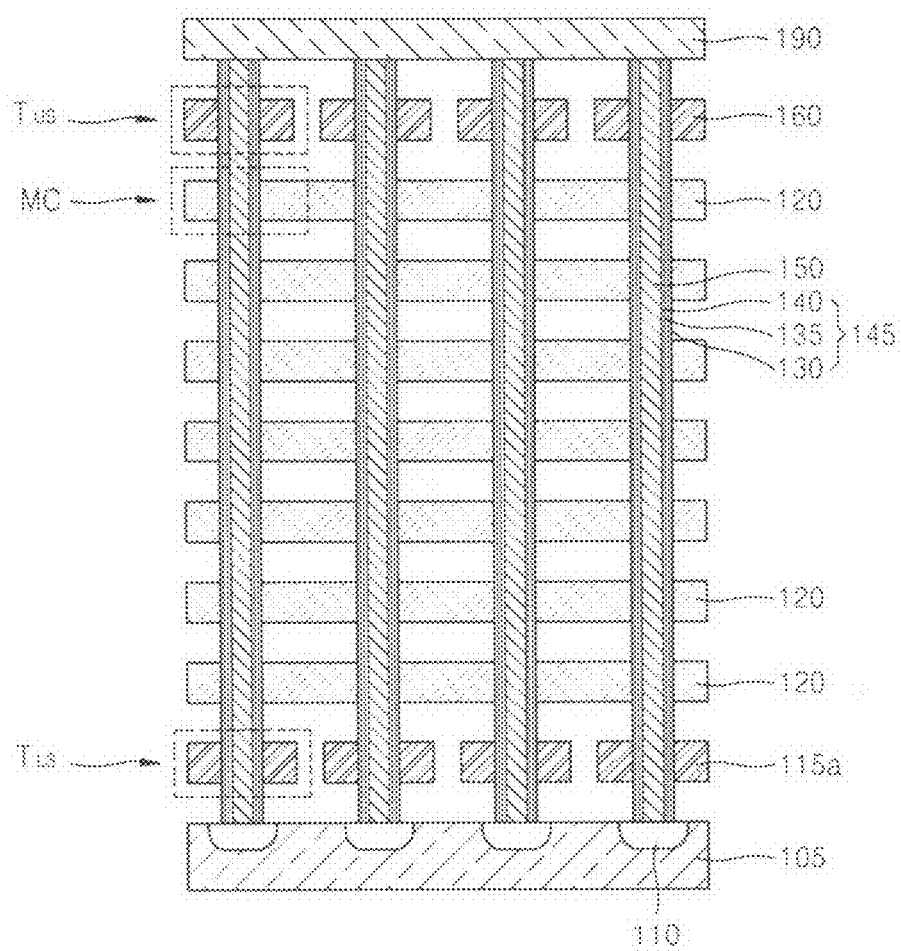
FIG. 6 is a cross-sectional view of a non-volatile memory device according to example embodiments.

FIG. 6 is a cross-sectional view of a non-volatile memory device according to example embodiments. A non-volatile memory device as illustrated in FIG. 6 may be a modified form of the non-volatile memory device illustrated in FIGS. 1 through 4. More particularly, the non-volatile memory device illustrated in FIG. 6 may be a modified form of the non-volatile memory device shown in FIG. 2. Descriptions of elements that are identical in example embodiments will be omitted.

Referring to FIG. 6, lower select gate electrodes 115a may intersect the plurality of semiconductor pillars 150. For example, the lower select gate electrodes 115a and the upper select gate electrodes 160 may be symmetrical about the control gate electrodes 120. Therefore, the lower select transistors $T_{LS}$ may have a vertical channel structure in example embodiments.

Figure 7:
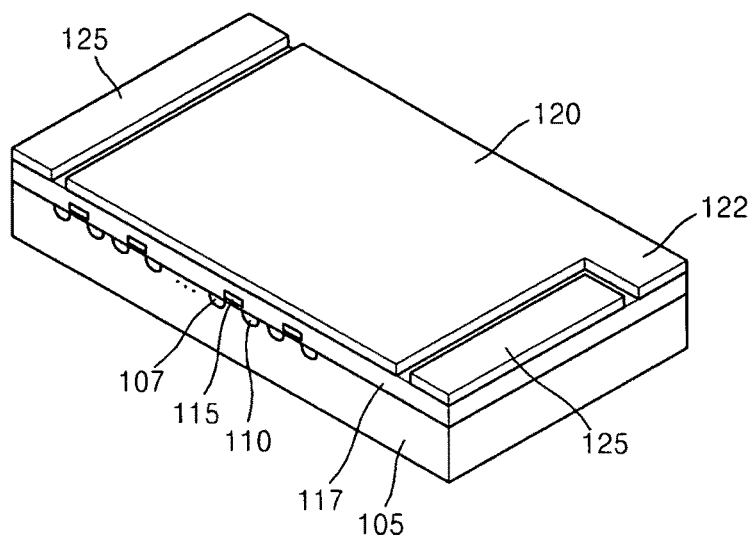
FIGS. 7 through 17 are diagrams illustrating a method of fabricating a non-volatile memory device according to example embodiments.

FIGS. 7 through 17 are diagrams illustrating a method of fabricating a non-volatile memory device according to example embodiments. Referring to FIG. 7, the lower select gate electrodes 115 may be formed on the substrate 105. Impurities may be doped into portions of the substrate 105 at both sides of the lower select gate electrodes 115 to form source regions 107 and the drain regions 110. A first interlayer insulation layer 117 may be formed on the substrate 105 to cover the lower select gate electrodes 115.

The control gate electrode 120 and the dummy electrode 125 may be formed on the first interlayer insulation layer 117. The control gate electrode 120 may have the protrusion 122 at one end. For example, the control gate electrode 120 and the dummy electrode 125 may be simultaneously formed by forming a conductive layer (not shown) on the first interlayer insulation layer 117 and patterning the conductive layer. Therefore, the dummy electrode 125 may actually be the remaining portions of a plate shaped conductive layer, the remaining portions excluding the control gate electrode 120 and the protrusion 122. For example, the conductive layer may be formed of doped poly-silicon or a metal, wherein the metal may include at least one of TiN, TaN, Al, W and/or Cu.

Figure 8:
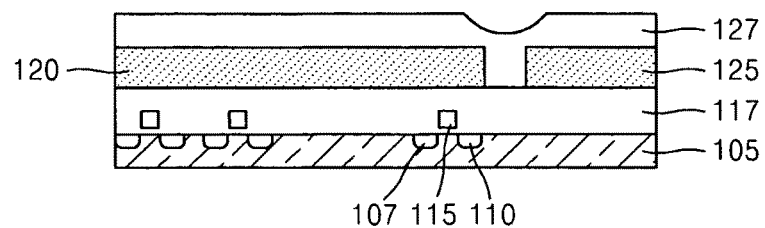
Figure 9:
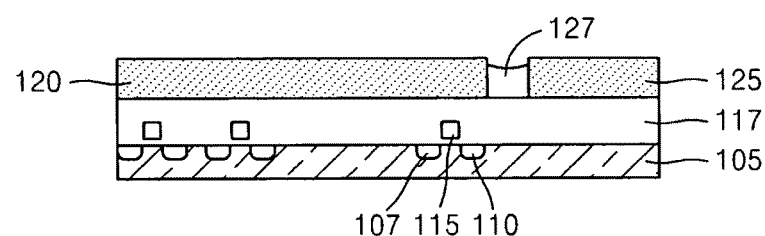
Figure 10:
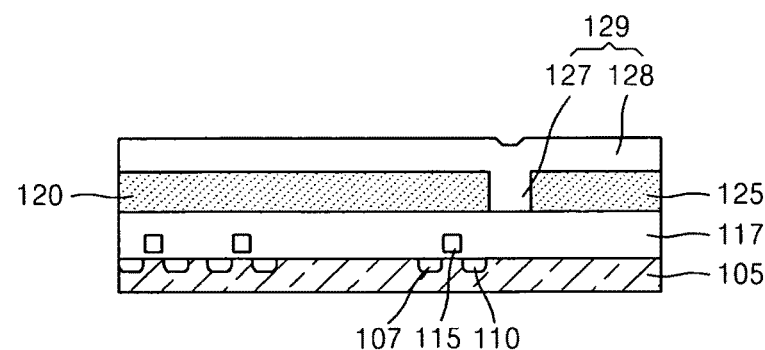

Referring to FIGS. 8 through 10, a second interlayer insulation layer 129 may be formed on the control gate electrode 120 and the dummy electrode 125. As illustrated in FIG. 8, a first insulation layer 127 may be formed to cover the control gate electrode 120 and the dummy electrode 125. For example, the first insulation layer 127 may be a spin-on-glass insulation layer or a tetraethylorthosilicate (TEOS) insulation layer, but example embodiments may not be limited thereto. As illustrated in FIG. 9, the first insulation layer 127 may be planarized. For example, the first insulation layer 127 may be planarized by using an etch back method. Alternatively, the first insulation layer 127 may be planarized by using a chemical mechanical polishing (CMP) method. As illustrated in FIG. 10, the second interlayer insulation layer 129 may be formed by forming a second insulation layer 128 on the first insulation layer 127.

Figure 11:
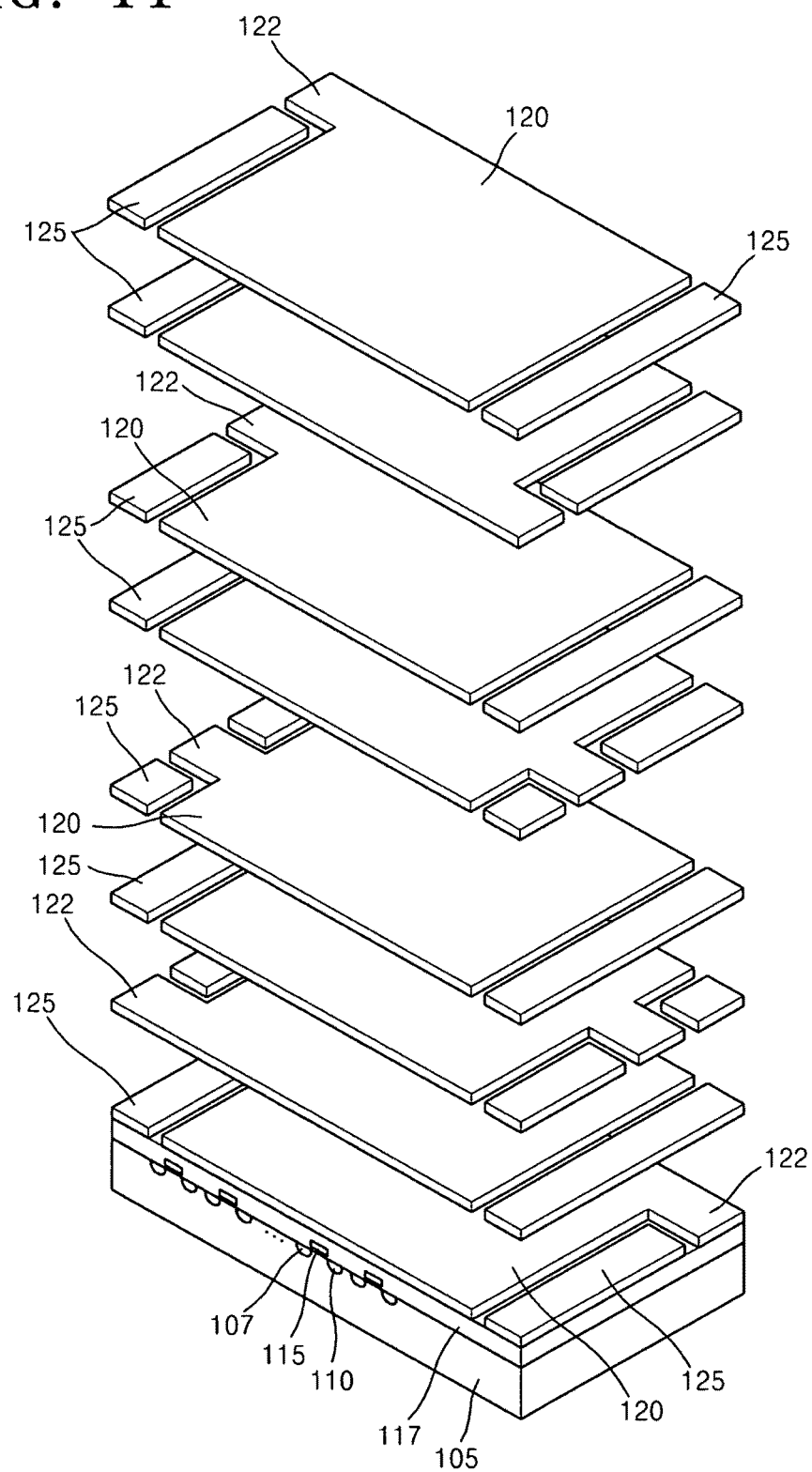
Figure 12:
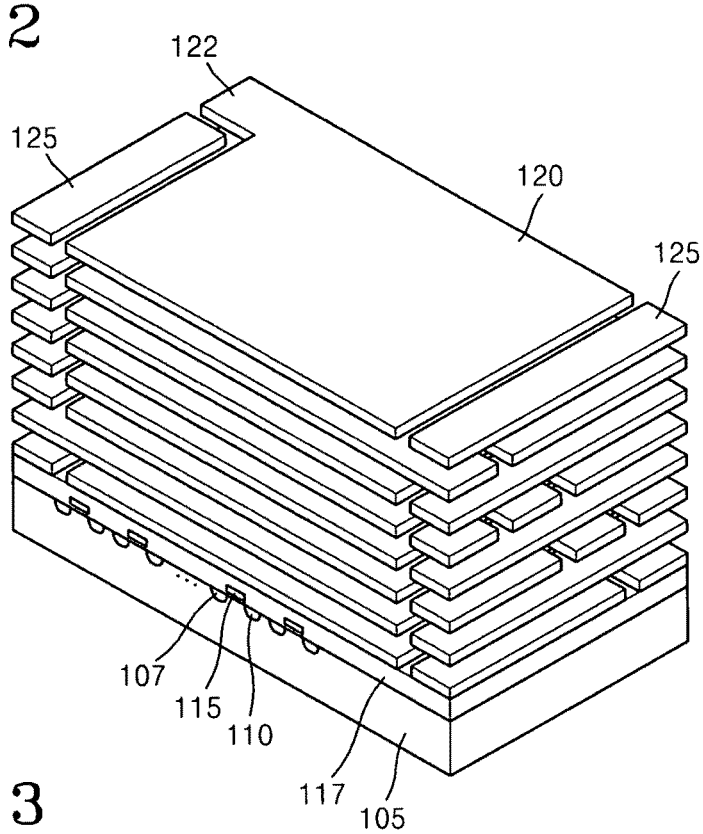

Referring to FIGS. 11 and 12, the control gate electrode 120 and the dummy electrode 125 may be repetitively stacked on the substrate 105. As described above in reference to FIG. 7, the control gate electrodes 120 and the dummy electrodes 125 may be formed on a same plane by patterning a single conductive layer. The protrusions 122 and the dummy electrodes 125 may be positioned differently in different layers.

As described above in reference to FIGS. 8 through 10, the second interlayer insulation layers 129 may be formed between the control gate electrodes 120 and between the dummy electrodes 125.

Figure 13:
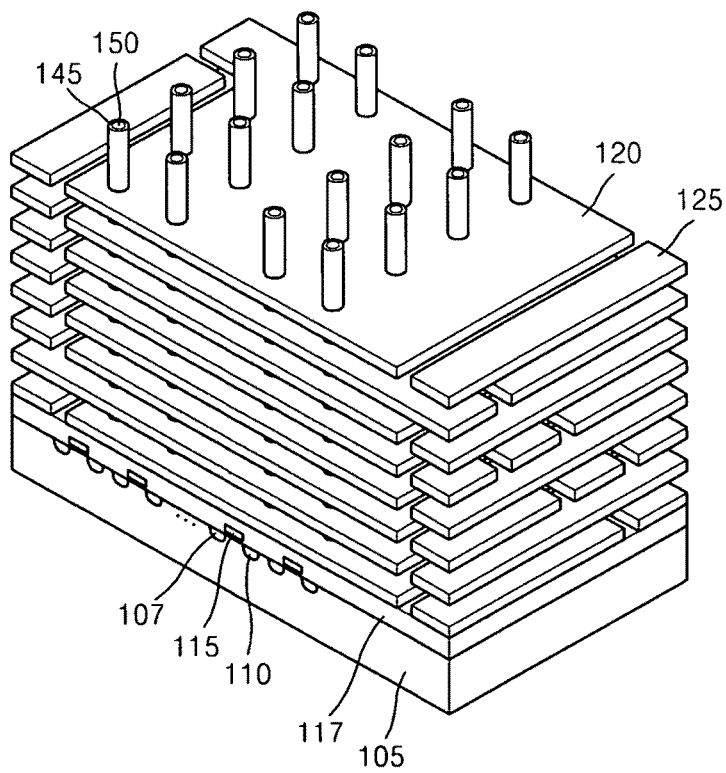
Figure 14:
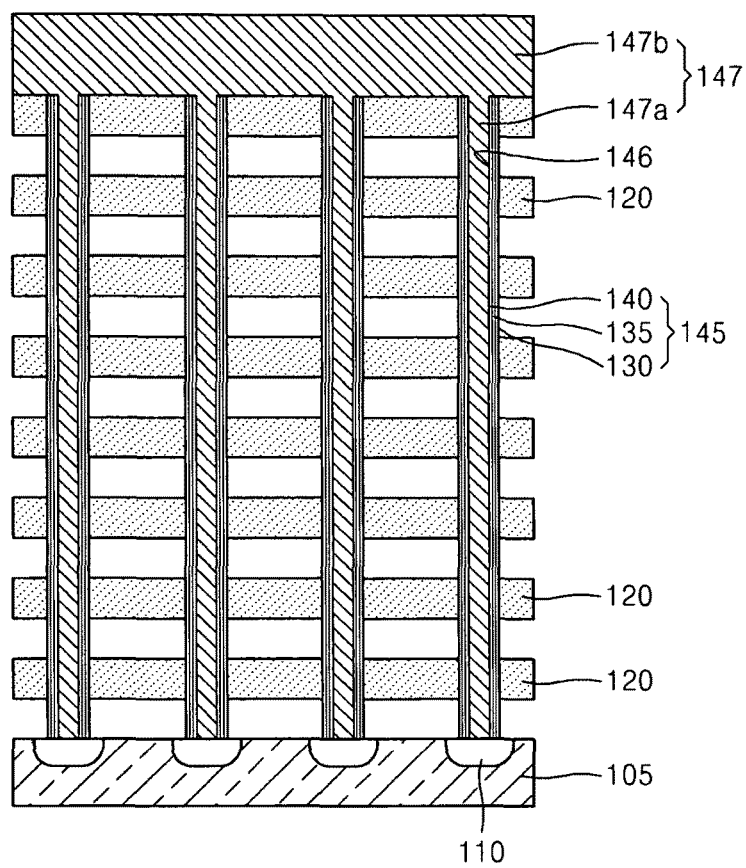

Referring to FIGS. 13 and 14, the plurality of storage media 145 may be formed on the substrate 105 to penetrate the control gate electrodes 120. For example, via holes 146 may be formed to penetrate the control gate electrodes 120, and the storage media 145 may be formed on inner sidewalls of the via holes 146. For example, as illustrated in FIG. 2, the blocking insulation layers 130 may be formed within the via holes 146, the charge storage layers 135 may be formed on the blocking insulation layers 130, and the tunnelling insulation layers 140 may be formed on the charge storage layers 135. The blocking insulation layers 130, the charge storage layers 135, and the tunnelling insulation layers 140 may be partially etched to expose the drain regions 110 below the via holes 146, and thus, the storage media 145 may be formed.

The plurality of semiconductor pillars 150 may be formed on the substrate 105 to penetrate the control gate electrodes 120. For example, the plurality of semiconductor pillars 150 may be formed on the substrate 105 to cover the storage media 145 and to fill the via holes 146. The plurality of semiconductor pillars 150 may be connected to the drain regions 110.

For example, as illustrated in FIG. 14, an amorphous semiconductor layer 147 may be formed to fill the via holes 146 and to cover the top surfaces of the control gate electrodes 120. The amorphous semiconductor layer 147 may be re-crystallized by performing excimer laser annealing (ELA) thereon. During the ELA annealing, most of a laser beam may be absorbed by the amorphous semiconductor layer 147 within a depth of about 2 nm from the top surface of the amorphous semiconductor layer 147. Therefore, most of the laser beam may be absorbed by a capping portion 147b of the amorphous semiconductor layer 147. Most heat generated by the capping portion 147b of the amorphous semiconductor layer 147 may be transmitted downward along a pillar portion 147a of the amorphous semiconductor layer 147 within the via holes 146, and, due to the second interlayer insulation layer 129 of FIG. 10, may not actually be transmitted via the control gate electrodes 120.

Accordingly, the amorphous semiconductor layer 147 in a nearly-molten state may be re-crystallized to form the plurality of semiconductor pillars 150. In example embodiments, because the core of re-crystallization is generated at the bottom of the pillar portion 147a close to the drain region 110 and grows in an upward direction therefrom, the plurality of semiconductor pillars 150 may actually have a columnar structure and may furthermore have a nearly single-crystal structure in short range. Therefore, the plurality of semiconductor pillars 150 may have a higher crystal quality as compared to conventional multi-crystal formations. Capping portions of the plurality of semiconductor pillars 150 corresponding to the capping portion 147b of the semiconductor layer 147 may be removed.

Figure 15:
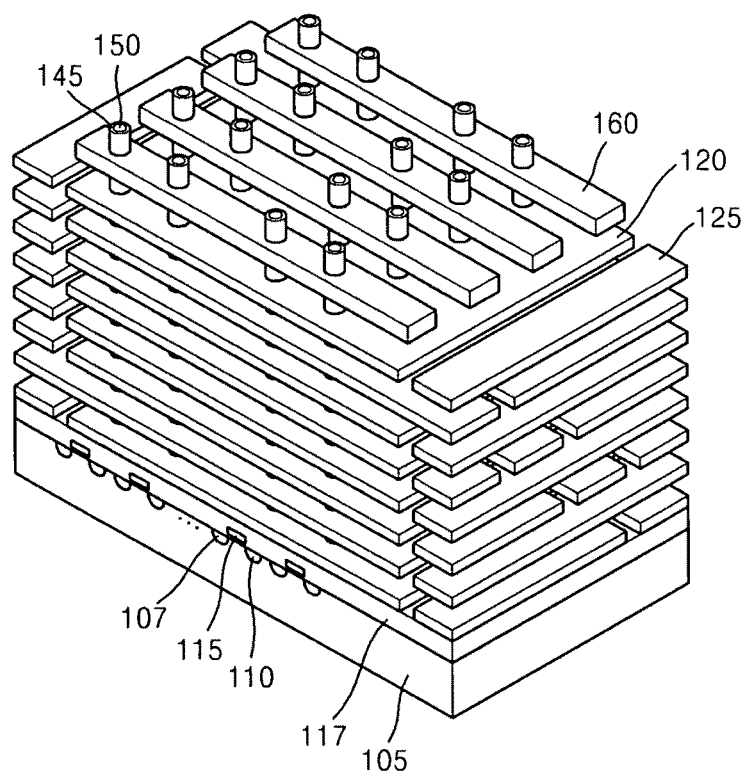

Referring to FIG. 15, the plurality of upper select gate electrodes 160 may be formed to partially intersect the plurality of semiconductor pillars 150. For example, each of the upper select gate electrodes 160 may extend in the row direction to surround the sidewalls of the storage media 145 outside the plurality of semiconductor pillars 150 in each row.

Figure 16:
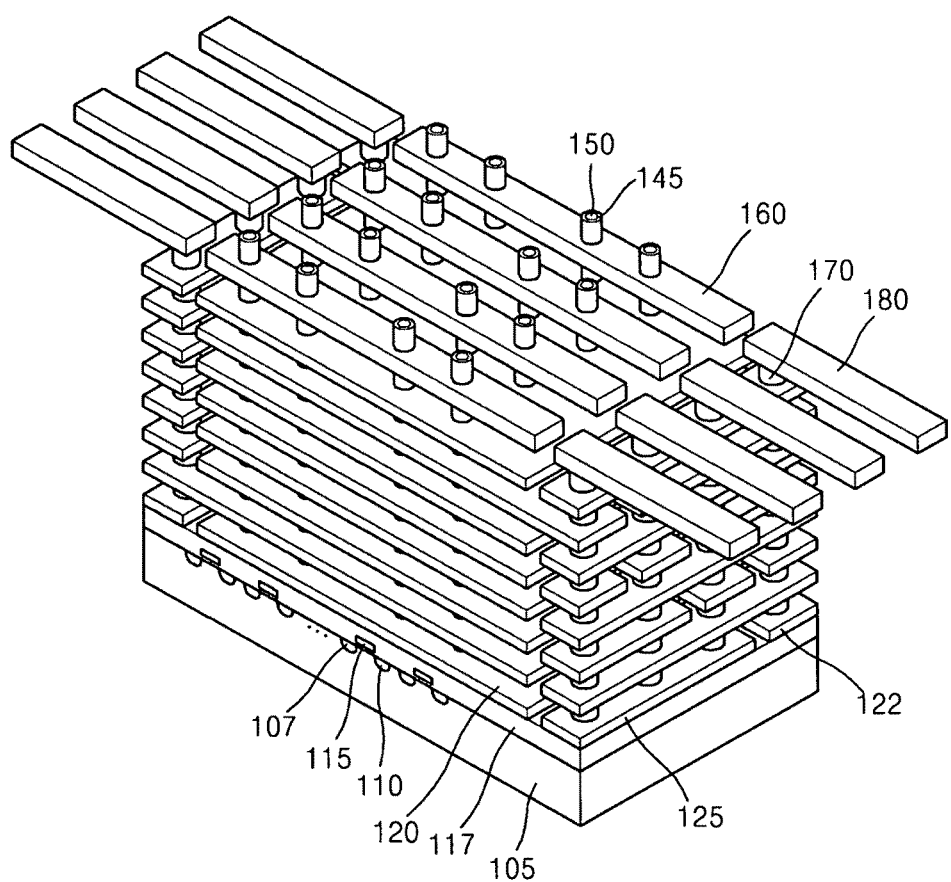

Referring to FIG. 16, the wordlines 180 may be formed to be connected to the control gate electrodes 120. For example, after the via plugs 170 are formed to penetrate the stacked structure of the protrusions 122 and the dummy electrodes 125, the wordlines 180 may be formed on the via plugs 170. The via plugs 170 may be formed by forming via holes (not shown) penetrating the stacked structure of the protrusions 122 and the dummy electrodes 125 and filling the via holes with a conductive material.

Each of the via plugs 170 and each of the wordlines 180 may be arranged with respect to each of the protrusions, e.g., via plug—protrusion—wordline. In example embodiments, the via plugs 170 and the wordlines 180 may be arranged at two opposite sides of the control gate electrodes 120, wherein the number of via plugs 170 and the number of wordlines 180 are the same as the number of control gate electrodes 120. In example embodiments as illustrated in FIG. 5, both the via plugs 170 and the wordlines 180 may be arranged at a same side of the control gate electrodes 120.

According to example embodiments, the via plugs 170 may be simultaneously formed to be respectively connected to the control gate electrodes 120. Therefore, the number of operations for forming the via plugs 170 does not increase even if the number of stacks of the control gate electrodes 120 increases. Thus, as compared to the case in which via plugs are separately formed for each layer, fabricating operations may be simplified, and thus, fabrication costs may be reduced.

Figure 17:
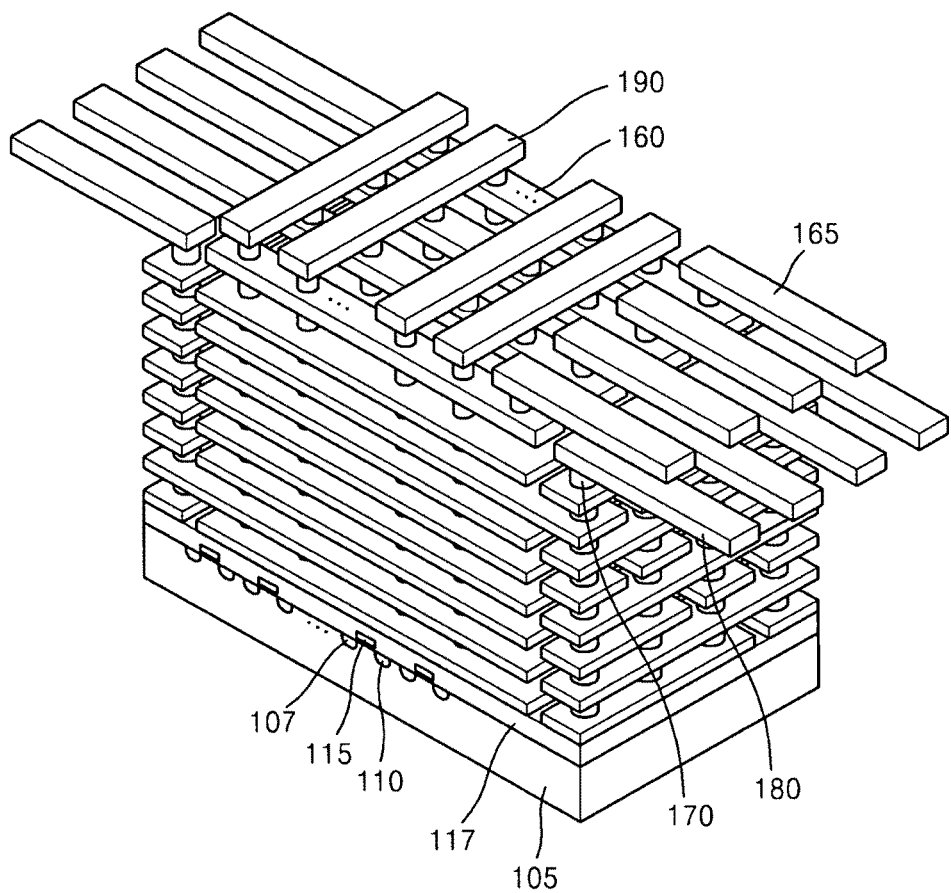

Referring to FIG. 17, the upper select lines 165 may be formed on the upper select gate electrodes 160. The upper select lines 165 may be connected to the upper select gate electrodes 160 via contact plugs (not shown). Alternatively, the upper select gate electrodes 160 and the upper select lines 165 may be provided as integrated elements instead of as individual elements.

The bitlines 190 may be formed on the plurality of semiconductor pillars 150. For example, the bitlines 190 may be formed by forming a conductive layer (not shown) on the plurality of semiconductor pillars 150 and patterning the conductive layer. A stacked structure sharing the bitlines 190 may be further formed on the bitlines 190 by repeating the operations shown in FIGS. 7 through 16.

Figure 18:
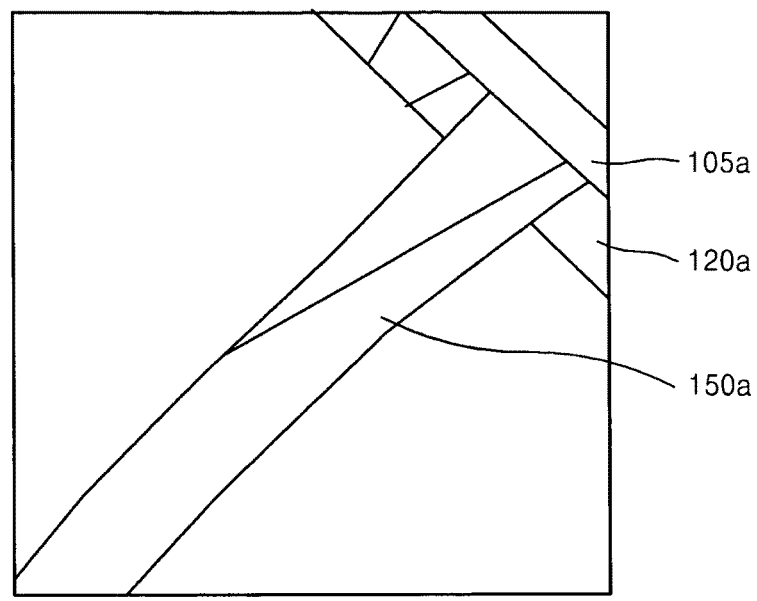
FIG. 18 is a cross-sectional view illustrating a crystal structure of a semiconductor pillar in a non-volatile memory device according to example embodiments.

FIG. 18 is a cross-sectional view illustrating a crystal structure of a semiconductor pillar in a non-volatile memory device according to example embodiments. Referring to FIG. 18, a semiconductor pillar 150a may be formed on a single-crystal substrate 105a by depositing an amorphous silicon layer to penetrate a control gate electrode 120a and re-crystallizing the amorphous silicon by performing ELA thereon. The semiconductor pillar 150a has a columnar structure containing coarse grains, and such columnar grains extend in a direction in which the semiconductor pillar 150a extends. In the semiconductor pillar 150a, a channel portion surrounded by the control gate electrode 120a has a single-crystal structure. Therefore, the semiconductor pillar 150a may have reduced trapping sites as compared to conventional polycrystal structures, and may furthermore have a quality close to that of a single-crystal structure.

Figure 19:
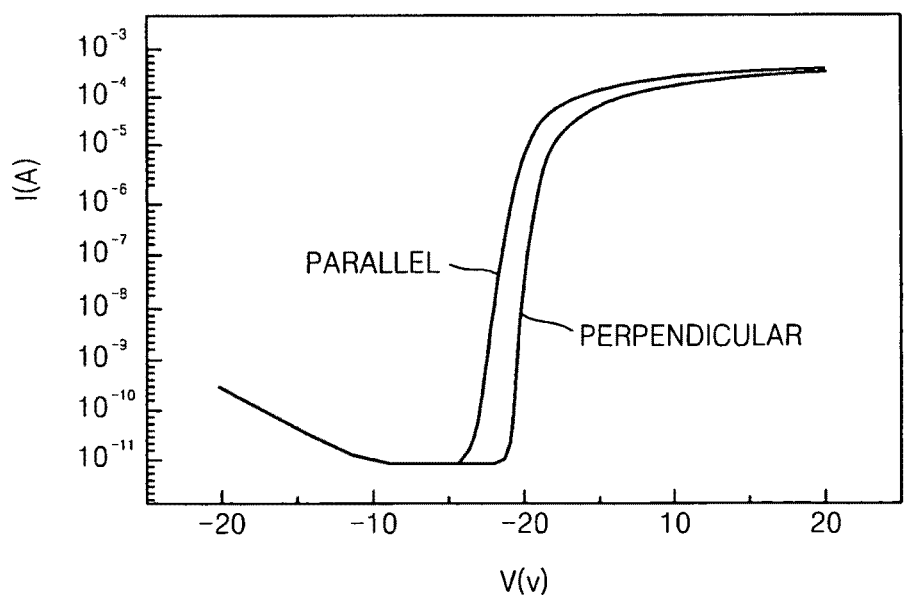
FIG. 19 is a graph showing voltage-current characteristics according to crystal structures of semiconductor pillars.

FIG. 19 is a graph showing voltage-current characteristics according to crystal structures of plurality of semiconductor pillars. Referring to FIG. 19, a current of a transistor in which a grain boundary of a channel layer may be parallel to the flow of current is greater than a current of a transistor in which the grain boundary of a channel layer is perpendicular to the flow of current. Therefore, because the semiconductor pillar 150a of FIG. 18 has a columnar structure parallel to the flow of current, the semiconductor pillar 150a of FIG. 18 is advantageous in terms of the magnitude of current, that is, the mobility of charges.

Figure 20:
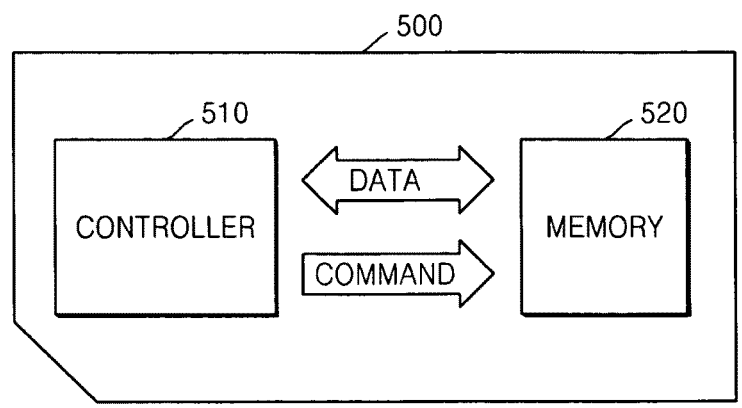
FIG. 20 is a schematic diagram illustrating a memory card 500 according to example embodiments.

FIG. 20 is a schematic diagram illustrating a memory card 500 according to example embodiments. Referring to FIG. 20, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1 through 6.

Such a memory card 500 may be used as a storage medium for various portable electronic devices. For example, the memory card 500 may be a multimedia card (MMC) or a secure digital (SD) card.

Figure 21:
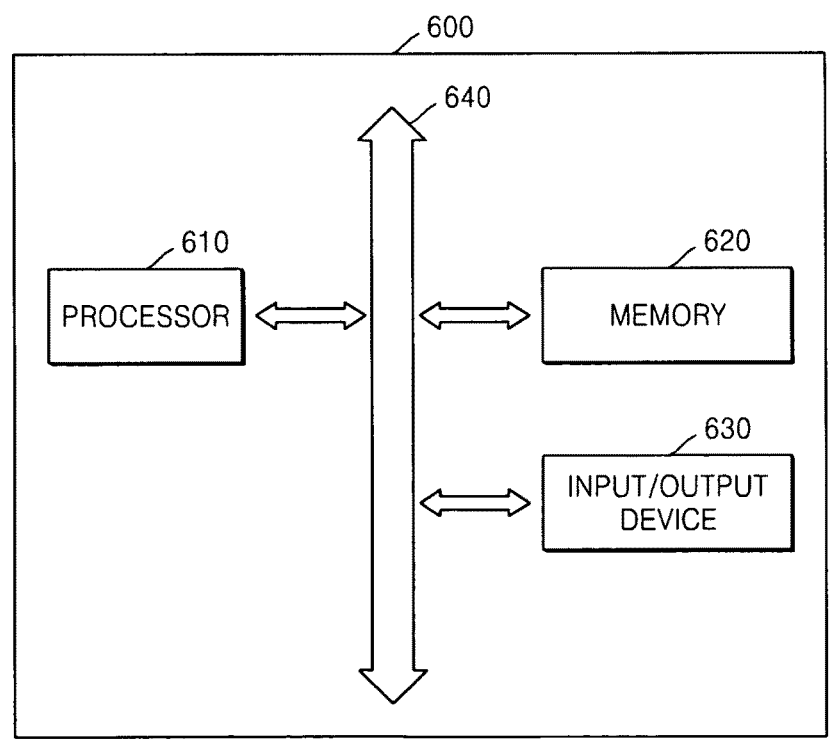
FIG. 21 is a block diagram illustrating an electronic system 600 according to example embodiments.

FIG. 21 is a block diagram illustrating an electronic system 600 according to example embodiments. Referring to FIG. 21, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. For example, the memory 620 may include one of the non-volatile memory devices described above in reference to FIGS. 1 through 6.

For example, such an electronic system 600 may embody various electronic control systems requiring the memory 620, and, for example, may be used in mobile phones, MP3 players, navigation devices, solid state disks (SSD), or household appliances.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A non-volatile memory device comprising:
    a substrate;
    a plurality of semiconductor pillars on the substrate;
    a plurality of control gate electrodes stacked on the substrate and intersecting the plurality of semiconductor pillars;
    a plurality of dummy electrodes stacked adjacent to the plurality of control gate electrodes on the substrate, the plurality of dummy electrodes being spaced apart from the plurality of control gate electrodes;
    a plurality of via plugs connected to the plurality of control gate electrodes; and
    a plurality of wordlines on the plurality of via plugs,
    wherein each of the plurality of via plugs penetrates a corresponding one of the plurality of control gate electrodes and at least one of the plurality of dummy electrodes, and
    wherein the plurality of control gate electrodes each includes a protrusion connected to the plurality of via plugs, and each of the plurality of dummy electrodes is adjacent to and spaced apart from the corresponding protrusion.

2. The non-volatile memory device of claim 1, wherein the plurality of dummy electrodes are on the same plane as the plurality of control gate electrodes at the outermost sides of the plurality of semiconductor pillars.

3. The non-volatile memory device of claim 1, wherein the protrusions of the plurality of control gate electrodes are stacked such that the protrusions do not overlap each other.

4. The non-volatile memory device of claim 1, wherein the protrusions of the plurality of control gate electrodes are alternately stacked at two opposite sides of the plurality of control gate electrodes.

5. The non-volatile memory device of claim 1, wherein the protrusions of the plurality of control gate electrodes extend diagonally across such that the protrusions do not overlap each other.

6. The non-volatile memory device of claim 1, wherein the plurality of via plugs and the plurality of wordlines are separately arranged at two opposite sides of the plurality of control gate electrodes.

7. The non-volatile memory device of claim 1, wherein the plurality of semiconductor pillars are arranged in columns, further comprising:
a plurality of bitlines on the plurality of control gate electrodes to connect the plurality of semiconductor pillars in a vertical direction.

8. The non-volatile memory device of claim 7, further comprising:
a plurality of upper select gate electrodes between the plurality of control gate electrodes and the plurality of bitlines to intersect the plurality of semiconductor pillars in a horizontal direction.

9. The non-volatile memory device of claim 7, further comprising:
a plurality of lower select gate electrodes on portions of the substrate, wherein the portions are adjacent to the plurality of semiconductor pillars and the plurality of control gate electrodes in a vertical direction.

10. The non-volatile memory device of claim 7, further comprising:
a plurality of lower select gate electrodes between the substrate and the plurality of control gate electrodes to intersect the sidewalls of the plurality of semiconductor pillars in a horizontal direction.

11. The non-volatile memory device of claim 1, further comprising:
a plurality of charge storage layers between the sidewalls of the plurality of semiconductor pillars and the plurality of control gate electrodes.

12. The non-volatile memory device of claim 11, further comprising:
a plurality of tunneling insulation layers between the sidewalls of the plurality of semiconductor pillars and the plurality of charge storage layers; and
a plurality of blocking insulation layers between the plurality of charge storage layers and the plurality of control gate electrodes.

13. A non-volatile memory device comprising:
a substrate;
a plurality of semiconductor pillars on the substrate;
a plurality of control gate electrodes stacked on the substrate and intersecting the plurality of semiconductor pillars;
a plurality of dummy electrodes stacked adjacent to the plurality of control gate electrodes on the substrate, the plurality of dummy electrodes being spaced apart from the plurality of control gate electrodes;
a plurality of via plugs connected to the plurality of control gate electrodes;
a plurality of wordlines on the plurality of via plugs;
a plurality of bitlines on the plurality of control gate electrodes to connect the plurality of semiconductor pillars in a horizontal direction;
a plurality of upper select gate electrodes on the plurality of control gate electrodes to intersect the plurality of semiconductor pillars in a horizontal direction; and
a plurality of lower select gate electrodes on portions of the substrate adjacent to the plurality of semiconductor pillars in a horizontal direction and adjacent to the plurality of control gate electrodes in a vertical direction,
wherein a length of the plurality of lower select gate electrodes extends in a same direction as a length of the plurality of bitlines,
wherein each of the plurality of via plugs penetrates a corresponding one of the plurality of control gate electrodes and at least one of the plurality of dummy electrodes, and
wherein the plurality of control gate electrodes each includes a protrusion connected to the plurality of via plugs, and each of the plurality of dummy electrodes is adjacent to and spaced apart from the corresponding protrusion.

* * * * *